US006265929B1

(12) United States Patent
Hauser

(10) Patent No.: US 6,265,929 B1
(45) Date of Patent: Jul. 24, 2001

(54) CIRCUITS AND METHODS FOR PROVIDING RAIL-TO-RAIL OUTPUT WITH HIGHLY LINEAR TRANSCONDUCTANCE PERFORMANCE

(75) Inventor: Max Wolff Hauser, Sunnyvale, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/113,618

(22) Filed: Jul. 10, 1998

(51) Int. Cl.[7] .................................................... H03K 17/62
(52) U.S. Cl. ............................................ 327/404; 327/103
(58) Field of Search ..................................... 327/103, 315, 327/317, 403, 404, 100, 108; 330/255, 257, 263, 267, 268, 273, 274

(56) References Cited

U.S. PATENT DOCUMENTS

| | | | | |
|---|---|---|---|---|
| 5,028,881 | * | 7/1991 | Spence | 330/253 |
| 5,361,040 | * | 11/1994 | Barrett, Jr. | 330/253 |
| 5,625,306 | * | 4/1997 | Tada | 327/403 |
| 5,844,442 | * | 12/1998 | Brehmer | 330/258 |

OTHER PUBLICATIONS

Joseph N. Babanezhad et al.: "A Programmable Gain/Loss Circuit,"IEEE Journal of Solid–State Circuits, vol. SC–22, No. Dec 6, 1987.*

Klaas–Jan de Langen, Ron Hogervorst, and Johan H. Huijsing; "Translinear circuits in low–voltage operational amplifiers;" In Sansen, Huijsing, and van de Plassche, editors, *Analog Circuit Design: MOST RF Circuits, Sigma–Delta Converters, and Translinear Circuits*, Kluwer Academic Publishers, 1996.

Rinaldo Castello and Paul R. Gray; "A high–performance micropower switched–capacitor filter;" *IEEE Journal of Solid–State Circuits* vol. SC–20 No. 6 pp. 1122–1132, Dec. 1985.

Paul R. Gray; "Basic MOS operational amplifier design—an overview;" In Gray, Hodges, and Brodersen, editors, *Analog MOS Integrated Circuits*, IEEE Press, 1980.

* cited by examiner

*Primary Examiner*—Jung Ho Kim
(74) *Attorney, Agent, or Firm*—Fish & Neave; Matthew T. Byrne

(57) ABSTRACT

The circuits and methods of the present invention provide rail-to-rail output stages that cancel the non-linear components of the transconductances of transistors used in the output stages, that allow the idling current in the output stages to be controlled by external current sources and device size ratios, and that enable the idling current in the output stages to be maintained independently of manufacturing processes, temperature, and power supply voltages. The output stages generally comprise a complementary subcircuit, a current mirror and an output driver. The output stages receive an input signal and a bias voltage from an external source and responsively produce a push current that feeds current into a load and a pull current that pulls current from the load. When the push current matches the pull current, the output stages are said to be "idling." The bias voltage controls the idling current. By mimicking the voltages and currents produced in the output stages using similar components, a bias voltage generation circuit provides a bias voltage that enables the idling point to be maintained in the output stages independently of manufacturing processes, temperature, and power supply voltages.

32 Claims, 4 Drawing Sheets

CIRCUITS AND METHODS FOR PROVIDING RAIL-TO-RAIL OUTPUT WITH HIGHLY LINEAR TRANSCONDUCTANCE PERFORMANCE

BACKGROUND OF THE INVENTION

This invention relates to circuits and methods for providing rail-to-rail output stages. More particularly, this invention relates to circuits and methods for rail-to-rail output stages that provide high linearity without the use of feedback, that provide high linearity in their transconductance, that allow for designer-controllable idling currents, and that provide those designer-controllable idling currents independently of manufacturing processes, temperatures, and power supply voltages.

Rail-to-rail output stages are widely known in the prior art. The typical rail-to-rail output stage incorporates two common-source (or common-emitter) transistors of complementary polarities whose drains (or collectors) are connected together to form an output node that is connected to a load, whose sources (or emitters) are connected to a positive and a negative power supply voltage, and whose gates (or bases) are connected to two drive signals derived in turn from an external input signal. These output stages are very useful in that they maximize the output signal voltage swing capability of a circuit to nearly the limits of the power supply and, consequently, provide a maximal signal-to-noise ratio for a given noise level.

Many known circuits and methods for providing rail-to-rail output stages, however, exhibit very non-linear input to output transfer characteristics. These non-linear input to output characteristics often lead to signal distortion, especially at high frequencies where limited loop gain is available for correcting the output stage non-linearity by negative feedback. It is, therefore, desirable to provide high linearity in these output stages without the use of feedback.

In rail-to-rail output stages, it is often also desirable to maintain a known idling current flowing in each of the transistors of the output stage. This idling current is the current that flows in the transistors when the output stage is neither driving current into, nor sinking current from, a load that is connected to the output node. By maintaining an idling current in the transistors of the output stage, crossover distortion in the output stage is kept to a minimum. However, this idling current can be difficult to control because of variations in manufacturing processes, temperatures, and power supply voltages of the components used to implement the output stage.

SUMMARY OF THE INVENTION

In view of the foregoing, it is an object of this invention to provide rail-to-rail output stages that achieve high linearity.

It is a further object of this invention to provide rail-to-rail output stages that achieve high linearity in their transconductance.

It is a still further object of this invention to provide rail-to-rail output stages that allow for designer-controllable idling currents.

It is also an object of this invention to provide rail-to-rail output stages that achieve high linearity without the use of feedback.

It is a yet further object of this invention to provide rail-to-rail output stages that allow idling currents to be independent of manufacturing processes, temperatures, and power supply voltages.

In accordance with the present invention, circuits and methods for rail-to-rail output stages that achieve these and other objects are provided. More particularly, the circuits and methods of the present invention provide rail-to-rail output stages that cancel the non-linearities inherent in transconductances of transistors in the output stages, that allow the idling current in the output stages to be controlled by current sources and device-size ratios, and that enable the idling current in the output stages to be maintained independently of manufacturing processes, temperatures, and power supply voltages.

Generally speaking, at a functional level, output stages constructed in accordance with the present invention comprise a two-transistor complementary subcircuit, a current mirror circuit, and an output driver circuit. These circuits are arranged so that an input signal is provided to the two-transistor complementary subcircuit and the output driver circuit. A bias voltage is also connected to the two-transistor complementary subcircuit. The two-transistor complementary subcircuit and the output driver circuit may also be connected to a supply voltage. The two-transistor complementary subcircuit drives the current mirror circuit. The current mirror circuit is also connected to another supply voltage. The current mirror circuit and the output driver circuit share a common terminal which is connected to a load. The load is also connected to a ground typically having a potential between the voltage supplied by the two supply voltages.

In operation, preferred output stages constructed in accordance with the present invention receive an input signal from an external source and a bias voltage from a bias generator, such as that described below. Responsive to this input signal, an output driver may produce a push current that feeds current into a load. Responsive to a voltage difference created by the input signal and the bias voltage, a two-transistor complementary subcircuit may feed a subcircuit current into a current mirror. In proportion to this subcircuit current, the current mirror then pulls a pull current from the load. When the push current that is being fed into the load by the output driver matches the pull current that is being pulled into the current mirror from the load, the output stage is said to be "idling" because the net current flowing in the load is zero. The response of the load current to input-signal voltage is, as usual, termed transconductance.

While the output driver is providing at least some push current and the current mirror is pulling in at least some pull current, the output stages of the present invention provide a substantially linear transconductance. This linear transconductance is achieved by the output stages matching the non-linear component of the push-path transconductance with a canceling, non-linear component of the pull-path transconductance. When a sufficiently strong voltage is provided as an input signal, one of the push or pull currents stops flowing. Once one of these currents stops flowing, the output stage stops canceling the non-linear components of the output signal and, instead, enters class AB operation wherein power efficiency is improved.

The output stages of the present invention may also incorporate bias voltage generation circuits to produce voltages that can be used as bias voltages for the output stages. These bias voltage generation circuits produce the desired bias voltages by mimicking the transistor voltages and currents produced in the output stages when operating at their idling points. Consequently, the idling currents in the output stages can be set ratiometrically with device-size ratios and reference current sources. The bias voltage generation circuits produce bias voltages for the rail-to-rail output stages so that the desired idling currents will be produced in the output stages independently of integrated circuit manufacturing processes, temperatures, and power supply voltages.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

In accordance with the present invention, circuits and methods for providing rail-to-rail output stages are disclosed. The rail-to-rail output stages of the present invention achieve high linearity without the use of feedback by matching and canceling nonlinearities inherent in large-signal transconductance behavior of transistors in the output stages. Designer control of idling currents in these rail-to-rail output stages is facilitated by developing the idling currents from device-size ratios and reference currents.

For notational convenience, saturated-FET current-voltage equations are formulated herein in a threshold-voltage convention in which the threshold-voltage parameter ("$V_T$") is positive for enhancement-mode FETs of both n-channel and p-channel polarities. Also, voltages not indicated as being measured between a pair of terminals are with reference to a ground terminal not necessarily shown.

Figure 1:
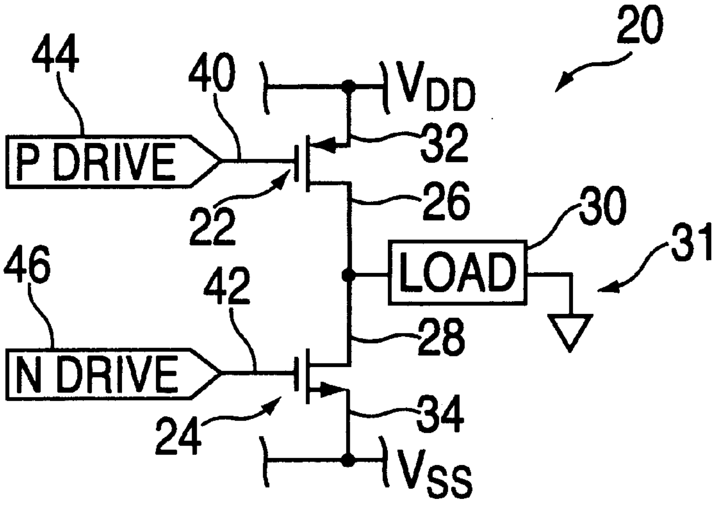
FIG. 1 (PRIOR ART)
FIG. 1 is a schematic diagram of a known configuration of a pair of output transistors in a rail-to-rail output stage.

FIG. 1 illustrates a known configuration 20 of a pair of output transistors in a rail-to-rail output stage. As shown, configuration 20 comprises PMOS FET 22 and NMOS FET 24 arranged with their drains 26 and 28, respectively, connected together and tied to a load 30, their sources 32 and 34 connected to $V_{DD}$ and $V_{SS}$ (the positive and negative rails), respectively, and their gates 40 and 42 connected to p-drive input 44 and n-drive input 46, respectively. Load 30 is also connected to ground 31 whose potential is typically between that of $V_{DD}$ and that of $V_{SS}$.

To drive the transistors of configuration 20 so that a current is created in load 30, drive voltages must be applied to inputs 44 and 46. When a drive voltage is applied at input 44 so that the source to gate voltage ($V_{SG}$) at FET 22 exceeds its PMOS threshold voltage ($V_{TP}$), a current flows out of drain 26. This current is controlled by the source to gate voltage of FET 22. When a drive voltage is applied at input 46 such that the gate to source voltage ($V_{GS}$) at FET 24 exceeds its NMOS threshold voltage ($V_{TN}$), a current flows into drain 28. This current is controlled by the gate to source voltage of FET 24.

The total current created in load 30 by FETs 22 and 24 is the difference between the current flowing out of drain 26 and the current flowing into drain 28. Thus, when the current flowing out of drain 26 exceeds the current flowing into drain 28, a current flows through load 30 toward ground 31. When the current flowing out of drain 26 is less than the current flowing into drain 28, a current flows through load 30 away from ground 31. Finally, when the current flowing out of drain 26 equals the current flowing into drain 28, the output stage is said to be at its idling point and no current flows through load 30. At this idling point, the current flowing out of drain 26 and into drain 28 is referred to as the idling current ("$I_Q$") of FETs 22 and 24.

Figure 2:
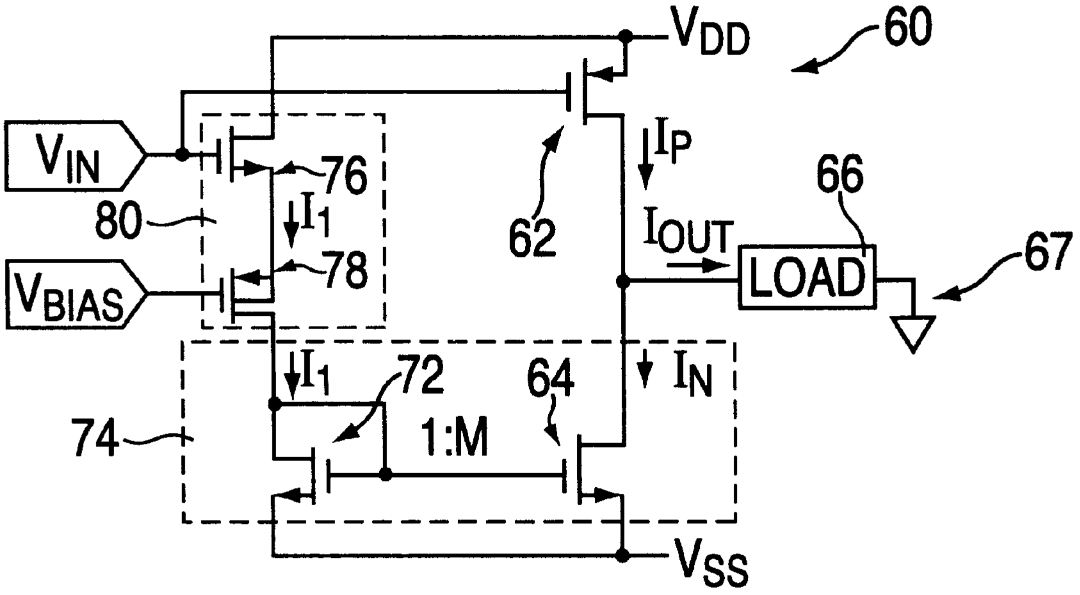
FIG. 2 is a schematic diagram of an illustrative embodiment of a rail-to-rail output stage in accordance with the present invention.

A circuit that provides high linearity and designer-controllable idling current in accordance with the present invention is illustrated in FIG. 2. As shown, output stage 60 includes a PMOS FET 62 and an NMOS FET 64 that have their drains connected together and tied to a load 66, and their sources connected to $V_{DD}$ and $V_{SS}$ respectively. Load 66 is also tied to a ground 67 whose potential is typically between that of $V_{DD}$ and that of $V_{SS}$. Also included in output stage 60 are an NMOS FET 72, which together with NMOS FET 64 forms a current mirror 74, and an NMOS FET 76 and a PMOS FET 78, which together form a two-transistor complementary subcircuit 80. As illustrated, the gate of FET 64 is connected to the gate and drain of FET 72 and the drain of FET 78. The source of FET 72 is tied to $V_{SS}$. The source and body terminal (to eliminate body effect) of FET 78 are connected to the source of FET 76. The drain of FET 76 is tied to $V_{DD}$. The gates of PMOS FET 62 and NMOS FET 76 are driven by $V_{IN}$, and the gate of PMOS FET 78 is connected to $V_{BIAS}$.

Current mirror 74 is intended to return a current $I_N$ that is close to M times its input current $I_1$, and to this end, NMOS FET 64 is preferably constructed from M identical parallel copies of NMOS FET 72, placed in close proximity to FET 72 to minimize thermal differences.

Figure 4:
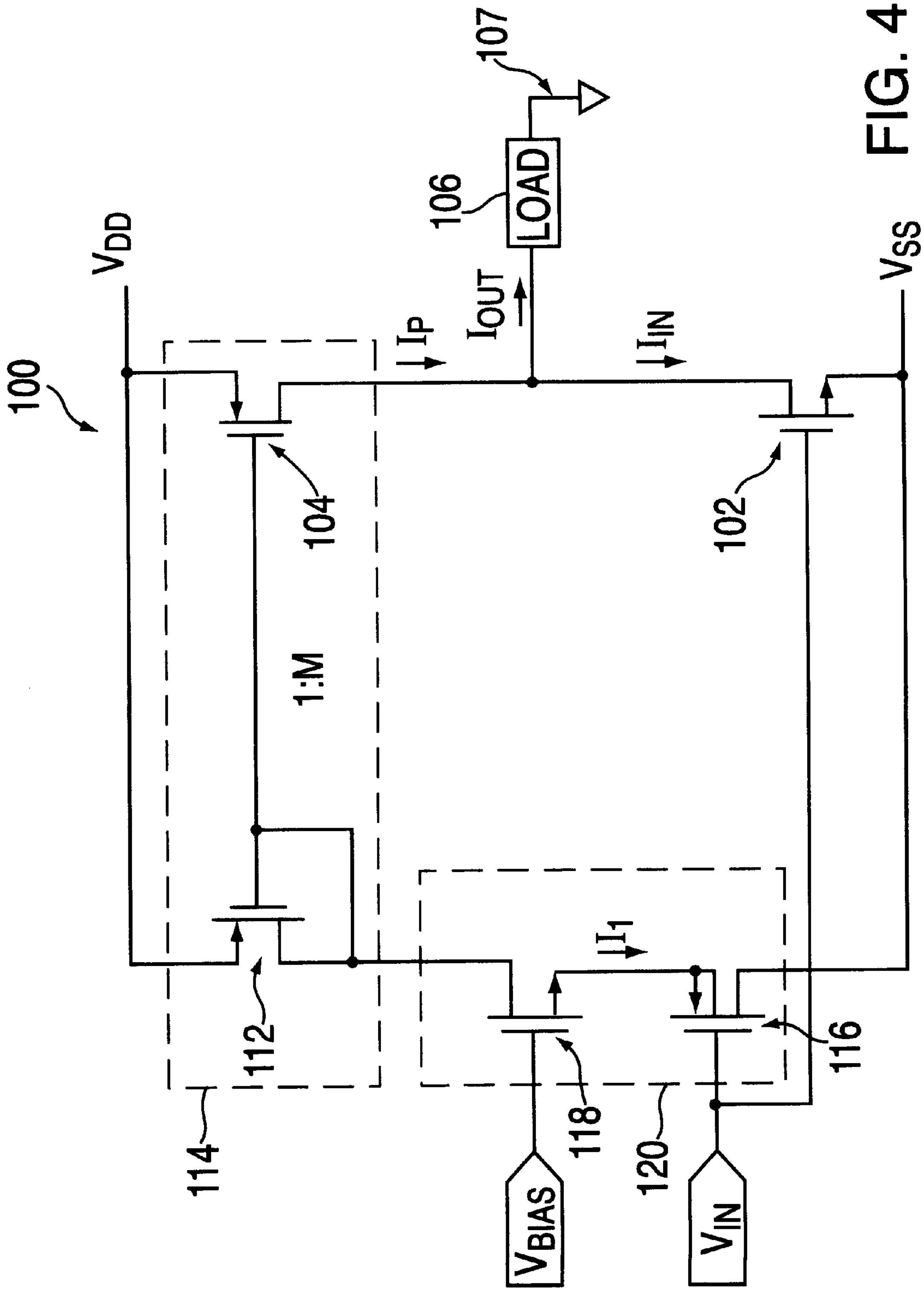
FIG. 4 is a schematic diagram of a second illustrative embodiment of a rail-to-rail output stage that is arranged with its input signal driving an NMOS field effect transistor (FET) in accordance with the present invention.
Figure 5:
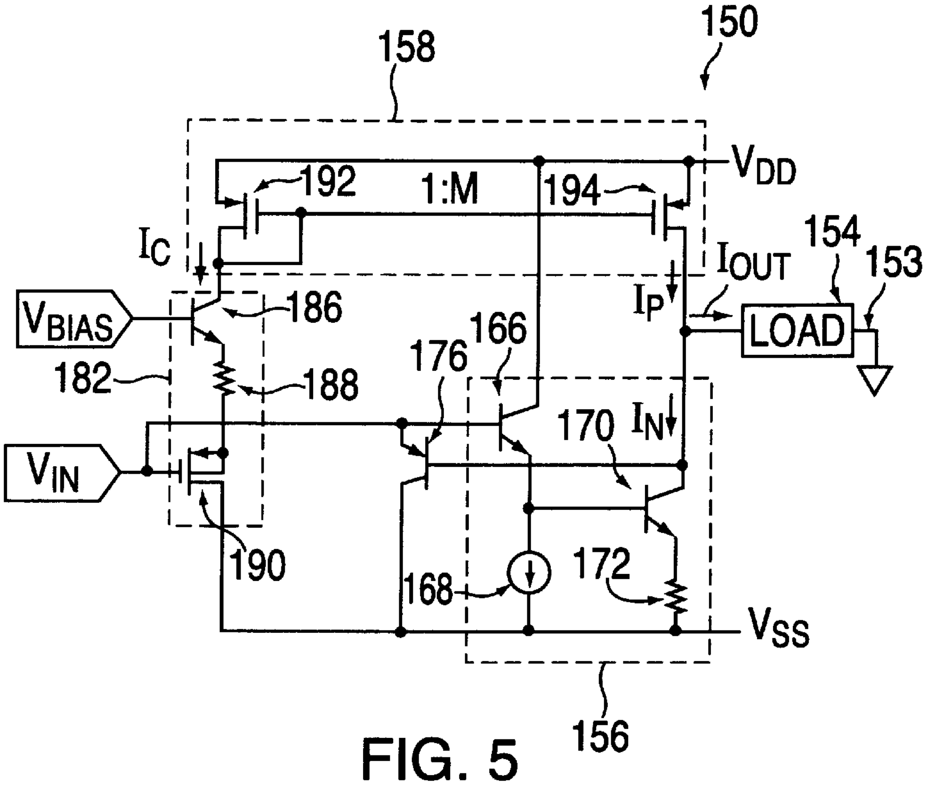
FIG. 5 is a schematic diagram of a third illustrative embodiment of a rail-to-rail output stage that incorporates bipolar junction transistors (BJTs) in accordance with the present invention.
Figure 6:
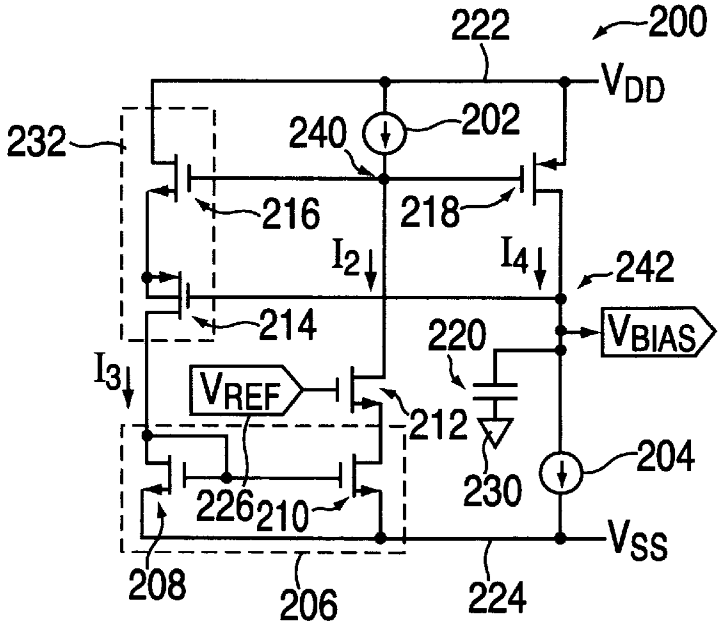
FIG. 6 is a schematic diagram of an illustrative embodiment of a biasing circuit for providing a desired bias voltage ($V_{BIAS}$) in accordance with the present invention.

For purposes of illustration, FIG. 2 as well as later FIGS. 4, 5 and 6 show examples of integrated circuits manufactured in an N-well CMOS fabrication process. Therefore in these figures, the P-type substrates of the illustrated integrated circuits are implicitly connected to $V_{SS}$, and in PMOS transistors whose well ("body") connection is not shown explicitly, the body is tied to $V_{DD}$, following typical practice in the art. In FIG. 2, the connection of the body terminal of FET 78 to its source terminal removes the effect of body-to-source voltage on threshold voltage (the "body effect") in FET 78. All of the circuits described here can also be implemented in P-well or other CMOS processes, or in N-well processes with PMOS body connections different from those in the figures, in accordance with the invention.

Although circuit 60 is illustrated using PMOS and NMOS FETs 62, 64, 72, 76 and 78, persons skilled in the art will appreciate that some or all of these devices could be replaced with different polarity FETs, with the same or different polarity BJTs, etc. Also, although not illustrated, the drain current of FET 76 could be recovered and incorporated into $I_{out}$ by, for example, inserting a resistor between $V_{DD}$ and the junction of the source of FET 62 and the drain of FET 76.

Output stage 60 generally operates as follows. A current $I_{OUT}$ is produced in load 66 under the control of inputs provided by $V_{IN}$ and $V_{BIAS}$. $I_{OUT}$ is the difference between push current $I_P$ (provided by the drain of FET 62) and pull current $I_N$ (provided by the drain of FET 64). Like the current flowing out of the drain of FET 22 of FIG. 1, current $I_P$ is controlled directly by $V_{IN}$, and is a function of the difference between the voltages at $V_{DD}$ and $V_{IN}$.

Unlike the current flowing into the drain of FET 24 of FIG. 1, current $I_N$ flowing into the drain of FET 64 is not controlled directly by a single, dedicated input. Rather, current $I_N$ is a function of the combination of the signals at $V_{IN}$ and $V_{BIAS}$. Based upon the voltages at $V_{IN}$ and $V_{BIAS}$, a current $I_1$ flows through subcircuit 80. As explained in detail below, subcircuit 80 acts analogously to an NMOS FET whose threshold voltage is controllable by $V_{BIAS}$ and whose transconductance factor is a combination of those of FETs 76 and 78. Current $I_1$ also flows through FET 72 of current mirror 74. Based upon the current ratio of current mirror 74, current $I_N$ flows into the drain of FET 64 at a rate that is M times current $I_1$ flowing through FET 72.

Figure 3:
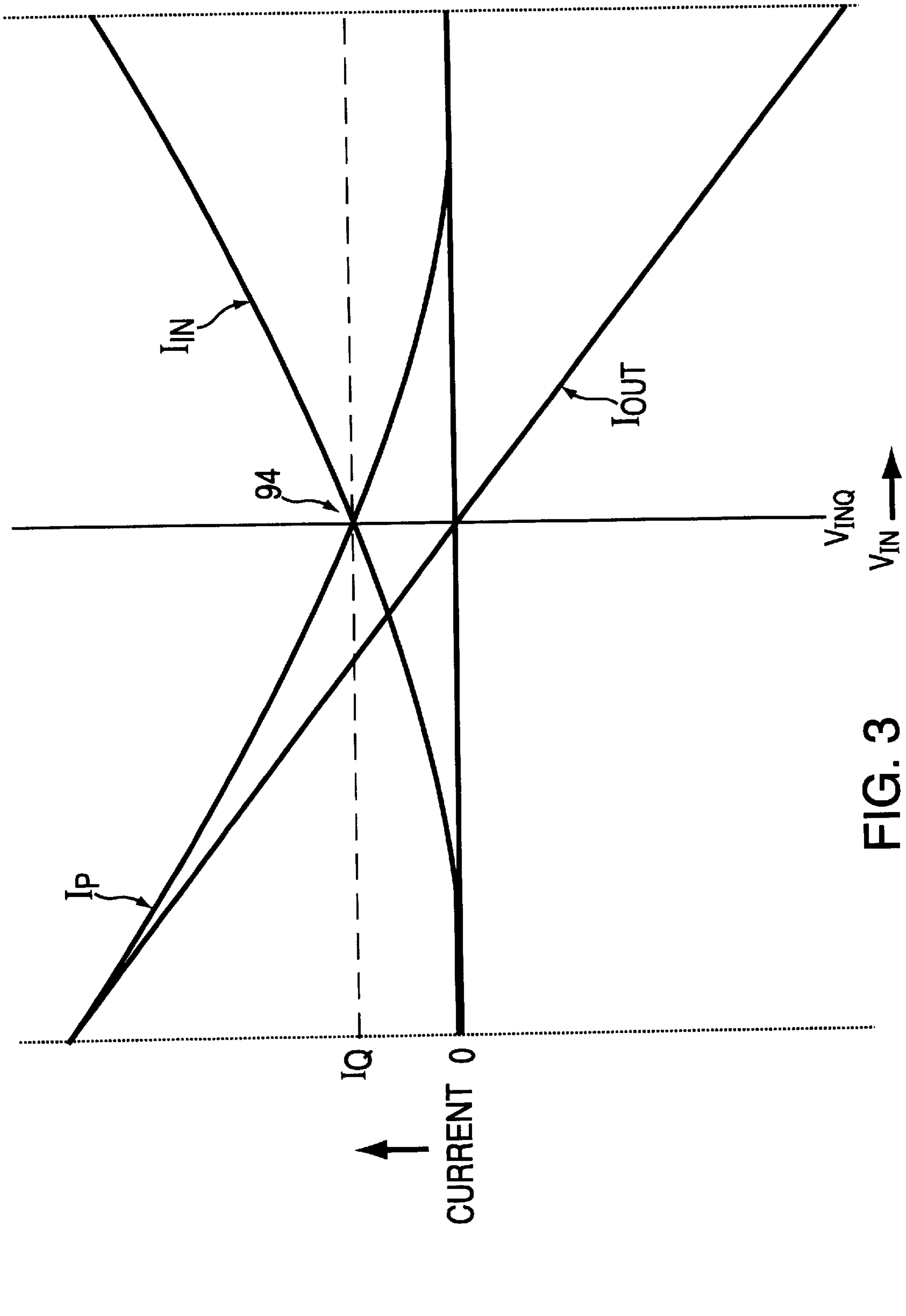
FIG. 3 is a graph illustrating the voltage-to-current relationship between the input signal ($V_{IN}$) and the push current ($I_P$), the pull current ($I_N$), and the output current ($I_{OUT}$) of the circuit of FIG. 2.

Turning to FIG. 3, the high linearity and designer-controllable idling current properties of the present invention are illustrated graphically. FIG. 3 shows the currents $I_P$, $I_N$ and $I_{OUT}$ that are produced as a function of the input signal at $V_{IN}$ (FIG. 2). As can be seen from FIG. 3, $I_P$ and $I_N$ behave non-linearly over the input voltage range illustrated. Because each of the FETs in FIG. 2 typically operate in saturation when turned on, currents $I_P$ and $I_N$ follow a square-law relationship. For an NMOS FET such as FET 64 of FIG. 2, this square-law relationship can be approximated mathematically as follows:

$$I_N \cong K_N(V_{GSN}-V_{TN})^2, \tag{1}$$

where $I_N$ is the drain current as defined in FIG. 2, $K_N$ is the transconductance factor, $V_{GSN}$ is the gate to source voltage, and $V_{TN}$ is the threshold voltage, of the NMOS FET. For a PMOS FET such as FET 62 of FIG. 2, using the threshold-voltage convention described earlier, this square-law relationship can be approximated mathematically as follows:

$$I_P \cong K_P(V_{SGP}-V_{TP})^2, \tag{2}$$

where $I_P$ is the drain current as defined in FIG. 2, $K_P$ is the transconductance factor, $V_{SGP}$ is the source to gate voltage, and $V_{TP}$ is the threshold voltage, of the PMOS FET.

To the accuracy of equations (1) and (2), referring to FIG. 2, it is clear that for PMOS FET 62, $I_P$ can also be represented by the following equation:

$$I_P=K_P(V_{DD}-V_{IN}-V_{TP})^2. \tag{3}$$

Alternatively, equation (3) can be stated as follows:

$$I_P=K_PV_{DD}^2-2K_PV_{DD}V_{IN}-2K_PV_{DD}V_{TP}+K_PV_{IN}^2+2K_PV_{IN}V_{TP}+K_PV_{TP}^2. \tag{4}$$

To similarly represent current $I_N$ in terms of $V_{IN}$, it is necessary to take into consideration the topology of output stage 60 and the characteristics of subcircuit 80 and current mirror 74. First, observing the topology of output stage 60, it is apparent that the gate to source voltage $V_{GS76}$ of FET 76 plus the source to gate voltage $V_{SG78}$ of FET 78 is equal to the input signal voltage $V_{IN}$ minus the bias voltage $V_{BIAS}$. This relationship can be represented by the following equation:

$$V_{GS76}+V_{SG78}=V_{IN}-V_{BIAS}. \tag{5}$$

Also, because the current $I_{D76}$ flowing into the drain of FET 76 is the same as the current $I_{D78}$ flowing out of the drain of FET 78, $I_1$ can be represented by the following relationship:

$$I_1=I_{D76}=I_{D78}. \tag{6}$$

Under the square-law relationship, the current in the drain of FET 76 can be approximated by the following equation:

$$I_{D76}=K_{76}(V_{GS76}-V_{T76})^2, \tag{7}$$

where $K_{76}$ is the transconductance factor, $V_{GS76}$ is the gate to source voltage, and $V_{T76}$ is the threshold voltage, of FET 76. Equation (7) can be stated alternatively as:

$$V_{GS76}=V_{T76}+(I_{D76}/K_{76})^{1/2}. \tag{8}$$

Similarly, under the square-law relationship, the current in the drain of FET 78 can be approximated by the following equation:

$$I_{D78}=K_{78}(V_{SG78}-V_{T78})^2, \tag{9}$$

where $K_{78}$ is the transconductance factor, $V_{SG78}$ is the source to gate voltage, and $V_{T78}$ is the threshold voltage, of FET 78. Equation (9) can be stated alternatively as:

$$V_{SG78}=V_{T78}+(I_{D78}/K_{78})^{1/2}. \tag{10}$$

Combining equations (5), (6), (8), and (10) and solving for $I_1$, it is apparent that $I_1$ can be represented by the following equation:

$$I_1=K_C(V_{IN}-V_{BIAS}-V_{T76}-V_{T78})^2, \tag{11}$$

where $K_C$ is defined by the following equation and represents the transconductance factor of subcircuit 80:

$$K_C=1/(1/K_{76}^{1/2}+1/K_{78}^{1/2})^2. \tag{12}$$

Because $I_N$ is proportional by a factor M to the current in FET 72 in accordance with the current ratio of current mirror 74, and because the current in FET 72 is equal to current $I_1$ in subcircuit 80, current $I_N$ can be represented by the following equation:

$$I_N=MI_1=MK_C(V_{IN}-V_{BIAS}-V_{T76}-V_{T78})^2, \tag{13}$$

or alternatively as:

$$I_N=MK_CV_{IN}^2-2MK_CV_{IN}V_{BIAS}-2MK_CV_{IN}V_{T76}-2MK_CV_{IN}V_{T78}+MK_CV_{BIAS}^2+2MK_CV_{BIAS}V_{T76}+2MK_CV_{BIAS}V_{T78}+MK_CV_{T76}^2+2MK_CV_{T76}V_{T78}+MK_CV_{T78}^2. \tag{14}$$

Referring to equation (4) above, it is apparent that $K_PV_{IN}^2$ is the only component of $I_P$ that is non-linear in $V_{IN}$, because $V_{DD}$ and $V_{TP}$ are independent of $V_{IN}$. Similarly, referring to equation (14) above, it is apparent that $MK_CV_{IN}^2$ is the only component of $I_N$ that is non-linear in $V_{IN}$, because $V_{BIAS}$, $V_{T76}$, and $V_{T78}$ are independent of $V_{IN}$.

In order to achieve linearity from $V_{IN}$ to $I_{OUT}$, it is necessary to eliminate the non-linear components of $I_P$ and $I_N$. As stated above, $I_{OUT}$ is simply the difference between $I_P$ and $I_N$, as expressed by the following equation:

$$I_{OUT}=I_P-I_N. \tag{15}$$

Accordingly, eliminating the non-linear components of $I_P$ and $I_N$ can be accomplished by matching and canceling the two non-linear components of $I_P$ and $I_N$. In order to do so, the following equation must be satisfied:

$$K_PV_{IN}^2=MK_CV_{IN}^2, \tag{16}$$

or as alternatively stated:

$$K_P=MK_C. \quad (17)$$

Thus, by selecting a combination of FET 62 with a transconductance $K_P$, FETs 76 and 78 with transconductances $K_{76}$ and $K_{78}$, respectively, and, therefore, a combined transconductance $K_C$, and FETs 64 and 72 so that current mirror 74 has a current ratio M, such that equation (17) is satisfied, output current $I_{OUT}$ will be a linear function of $V_{IN}$.

Although the principal non-linearity in the $V_{IN}$-to-$I_{OUT}$ relation has been canceled in output stage 60 by the constraint in equation (17), it is important also to provide for designability of the idling current $I_Q$ (the current that flows in devices 62 and 64 when $I_{OUT}$ is zero).

In FIG. 2, two separate paths link $V_{IN}$ to $I_{OUT}$: an upper ($I_P$) path through PMOS device 62 and a lower ($I_N$) path through the other devices. Separate, non-linear, large-signal $V_{IN}$-to-I curves govern these two paths, as illustrated in FIG. 3, even though the nonlinear parts of these curves cancel in $I_{OUT}$. The two curves intersect at point 94, where $I_P$ equals $I_N$, at a current value $I_Q$, which is the idling current. Intersection of the $I_P$ and $I_N$ curves occurs at a particular value of $V_{IN}$, which is referred to herein as "$V_{INQ}$."

The $V_{BIAS}$ voltage in FIG. 2 can be used to set the idling current value $I_Q$. This is because, as may be evident from the circuit of FIG. 2 and is also explicit in equation (13), $V_{BIAS}$, directly offsets the effect of $V_{IN}$ on $I_N$. That is, as $V_{BIAS}$ becomes more positive or negative, the value of $V_{IN}$ required to obtain a given value of $I_N$ changes, respectively positive or negative, by the same amount. The effect of this in the plot of FIG. 3 is to shift the $I_N$ curve to the right or left, respectively. $V_{BIAS}$ shifts the $I_N$ curve but not the $I_P$ curve, mathematically equation (3). Consequently, changing $V_{BIAS}$ changes the intersection current $I_Q$ and the corresponding voltage $V_{INQ}$.

Analyzing for the input-output relationship ($V_{IN}$ to $I_{OUT}$) in output stage 60 shows explicitly the form of dependance of $V_{INQ}$ and $I_Q$ on $V_{BIAS}$, the value of $V_{BIAS}$ necessary to bring about a desired value of $I_Q$, the corresponding value of $V_{INQ}$, and a simple relationship between $I_{OUT}$ and $V_{IN}$. From equations (3) and (13) and using the shorthand $V_{TC}=V_{T76}+V_{T78}$, $I_{OUT}$ can be represented by the following equation:

$$I_{OUT}=I_P-I_N=K_P(V_{DD}-V_{IN}-V_{TP})^2-MK_C(V_{IN}-V_{BIAS}-V_{TC})^2. \quad (18)$$

Using the earlier linearizing condition of equation (17) to eliminate the factor $MK_C$ and rearranging yields the general expression:

$$I_{OUT}=K_P[(V_{DD}-V_{TP})^2-(V_{BIAS}+V_{TC})^2-2V_{IN}(V_{DD}-V_{TP}-V_{BIAS}-V_{TC})]. \quad (19)$$

This $I_{OUT}$ is zero at a particular value of $V_{IN}$, called $V_{INQ}$. Solving for the condition $I_{OUT}=0$ and rearranging gives:

$$V_{INQ}=(V_{DD}-V_{TP}+V_{BIAS}+V_{TC})/2, \quad (20)$$

and the idling current $I_Q$, which is the value of $I_P$ (or $I_N$) when $V_{IN}=V_{INQ}$, can be shown to be:

$$I_Q=[K_P(V_{DD}-V_{TP}-V_{BIAS}-V_{TC})^2]/4. \quad (21)$$

The last expression can be rearranged for the required value of $V_{BIAS}$ to obtain a given idling current $I_Q$:

$$V_{BIAS}=V_{DD}-V_{TP}-V_{TC}-2(I_Q/K_P)^{1/2}. \quad (22)$$

Such a voltage can be derived in a $V_{BIAS}$ generator circuit using similar transistors, as shown below, and the output of this $V_{BIAS}$ generator circuit can simultaneously drive many output stages 60.

With this value of $V_{BIAS}$ applied, the input idling voltage $V_{INQ}$ becomes:

$$V_{INQ}=V_{DD}-V_{TP}-(I_Q/K_P)^{1/2}. \quad (23)$$

When this proper $V_{BIAS}$ of equation (22) is applied to an output stage 60 also satisfying the linearity condition of equation (17), the input-output relation of equation (19) simplifies (using the foregoing results) to:

$$I_{OUT}=-4(K_PI_Q)^{1/2}(V_{IN}-V_{INQ}). \quad (24)$$

Equation (24) is valid as long as the FETs in output stage 60 are in normal strong-inversion saturated operation, and in particular, conducting current. Within that constraint, equation (24) is a general, or large-signal, result, not the far more common situation of a linearized model predicated on signal excursions being negligible. This is a major benefit of the invention. The linearizing condition $K_P=MK_C$ of equation (17) is easily satisfied because four different factors enter into it: the size of FET 76 (which contributes to $K_{76}$ and hence $K_C$ as shown in equation (12)); the size of the FET 78 (which contributes to $K_{78}$ and hence $K_C$ as shown in equation (12)); the size ratio of FETs 72 and 64 via current mirror ratio M; and the size of FET 62 via the factor $K_P$. These four factors can be combined in many different ways to satisfy equation (17).

In order for output stage 60 to cancel the non-linear components of currents $I_P$ and $I_N$ as described above, both FETs 62 and 64 must be conducting current, and, thus, output stage 60 must be in the class A operating mode. Once one of FETs 62 or 64 has shut off, the non-linear cancellation feature of output stage 60 no longer functions, and, accordingly, output stage 60 leaves the class A operating mode and enters the class AB operating mode, wherein power efficiency is improved.

An alternate embodiment of output stage 60 is illustrated by output stage 100 in FIG. 4. In output stage 100, $V_{IN}$ drives an NMOS FET 102 rather than driving a PMOS FET as is done in output stage 60 of FIG. 2.

Like output stage 60, output stage 100 includes NMOS FET 102 and PMOS FET 104 whose drains are connected together and tied to load 106, and whose sources are connected to $V_{SS}$ and $V_{DD}$, respectively. Load 106 is also connected to ground 107 whose potential is typically between that of $V_{DD}$ and that of $V_{SS}$. $I_{OUT}$ flowing in load 106 is the difference between $I_P$ flowing out of the drain of FET 104 and $I_N$ flowing into the drain of FET 102. Also included in output stage 100 are PMOS FET 112, which together with PMOS FET 104 forms 1:M current mirror 114, and PMOS FET 116 and NMOS FET 118, which together form two-transistor complementary subcircuit 120. As illustrated, the gate of FET 104 is connected to the gate and drain of FET 112 and the drain of FET 118. The source of FET 112 is tied to $V_{DD}$. The source of FET 118 is connected to the source of FET 116, which is also connected to the body terminal of FET 116 (to eliminate body effect). The drain of FET 116 is connected to $V_{SS}$. The gates of NMOS FET 102 and PMOS FET 116 are driven by $V_{IN}$, and the gate of NMOS FET 118 is connected to $V_{BIAS}$.

Although circuit 100 is illustrated with PMOS and NMOS FETs 102, 104, 112, 116, and 118, persons skilled in the art will appreciate that some or all of these devices could be replaced with different polarity FETs, with the same or different polarity BJTS, etc. Also, although not illustrated, the drain current of FET 116 could be recovered and incorporated into $I_{OUT}$ by, for example, inserting a resistor between $V_{SS}$ and the junction of the source of FET 102 and the drain of FET 116.

Output stage 100 is an N-to-P complement, or "upside-down," variation of output stage 60 of FIG. 2. The operation of the two circuits 60 and 100 is exactly analogous, with the substitution of NMOS devices for PMOS and vice versa. Analysis of the operation of output stage 100 proceeds as for output stage 60, with the following basic results. For notational convenience, as with FIG. 2, saturated-FET current-voltage equations are formulated here so that the threshold-voltage parameters ("$V_T$") for both NMOS and PMOS polarities of FETs are positive with enhancement-mode devices. Parameters $K_N$ and $V_{TN}$ characterize output-driver NMOS FET 102. Two-transistor complementary subcircuit 120, like analogous subcircuit 80 of FIG. 2, can be characterized with composite parameters $V_{TC}$ and $K_C$, defined by:

$$V_{TC}=V_{T118}+V_{T116}, \tag{25}$$

and $$K_C=1/(1/K_{118}^{1/2}+1/K_{116}^{1/2})^2. \tag{26}$$

The components in currents $I_P$ and $I_N$ that are nonlinear functions of $V_{IN}$ cancel out in $I_{OUT}$ when the following condition is satisfied:

$$K_N=MK_C. \tag{27}$$

With this condition met, the required value of $V_{BIAS}$ to achieve a desired idling current $I_Q$ in both $I_P$ and $I_N$ is:

$$V_{BIAS}=V_{SS}+V_{TN}+V_{TC}+2(I_Q/K_N)^{1/2}. \tag{28}$$

With this value of $V_{BIAS}$ applied, the corresponding idling value of $V_{IN}$ is $V_{INQ}$, where:

$$V_{INQ}=V_{SS}+V_{TN}+(I_Q/K_N)^{1/2}, \tag{29}$$

and the overall input-output expression is:

$$I_{OUT}=-4(K_N I_Q)^{1/2}(V_{IN}-V_{INQ}). \tag{30}$$

FIG. 5 illustrates an output stage 150 incorporating Bipolar Junction Transistors (BJTs) in accordance with the present invention. Functionally, output stage 150 operates analogously to output stage 100 of FIG. 4. Although output stage 150 is illustrated with BJTs 166, 170, 176 and 186, and FETs 190, 192 and 194, output stage 150 could alternatively be implemented with some or all of the BJTs being replaced by the same or different polarity FETs and/or some or all of the FETs being replaced by the same or different polarity BJTs. Moreover, even though an output stage incorporating BJTs that operates analogously to output stage 100 is illustrated in FIG. 5, other output stages incorporating BJTs, such as an output stage incorporating BJTs that operates analogously to output stage 60, could be implemented in accordance with the present invention.

As shown in FIG. 5, output stage 150 includes a two-transistor complementary subcircuit 182, a current mirror 158, an output driver circuit 156 and a PNP BJT 176 that is used for anti-saturation clamping. Subcircuit 182 incorporates a PMOS FET 190, a resistor 188 and an NPN BJT 186. The gate of FET 190 is connected to $V_{IN}$ and the drain of FET 190 is connected to $V_{SS}$. One side of resistor 188 is connected to the source of FET 190, which is also connected to the body terminal of FET 190 (to eliminate body effect), and the other side of resistor 188 is connected to the emitter of NPN BJT 186. Connected to the base of BJT 186 is $V_{BIAS}$.

Current mirror 158 includes PMOS FET 192 and PMOS FET 194. The gate and drain of FET 192 and the gate of FET 194 are connected to the collector of BJT 186. The sources of FETs 192 and 194 are connected to $V_{DD}$. The drain of FET 194 is connected to one side of load 154. The other side of load 154 is connected to ground 153 whose potential is typically between that of $V_{DD}$ and that of $V_{SS}$.

Output driver circuit 156 incorporates NPN BJT 170, resistor 172, NPN BJT 166 and current source 168, which current source may be replaced by a resistor or omitted entirely. The collector of BJT 170 is connected to one side of load 154 and to the drain of FET 194, and the emitter of BJT 170 is connected to one side of resistor 172. The other side of resistor 172 is connected to Vs., The base of BJT 170 is connected to the emitter of BJT 166 and current source 168. Current source 168 is also connected to $V_{SS}$. The collector of BJT 166 is connected to $V_{DD}$ and the base of BJT 166 is connected to $V_{IN}$ and the emitter of PNP BJT 176. The base of PNP BJT 176 is connected to the collector of BJT 170 and the collector of PNP BJT 176 is connected to $V_{SS}$.

Although circuit 150 of FIG. 5 is illustrated with resistors 172 and 188, either or both of these resistors may be omitted entirely and replaced by a connection between the circuit nodes at their terminals.

As in output stages 60 and 100 of FIGS. 2 and 4, respectively, output stage 150 produces push current $I_P$ and pull current $I_N$ that control the current in load 154. $I_P$ is produced in response to a bias voltage provided at $V_{BIAS}$ and an input signal provided at $V_{IN}$. More particularly, when NPN transistor 186 and PMOS FET 190 are driven by $V_{BIAS}$ and $V_{IN}$, respectively, $I_C$ flows through BJT 186, resistor 188, and FET 190 of subcircuit 182. As with subcircuit 80 of FIG. 2 and subcircuit 120 of FIG. 4, the equivalent threshold voltage of subcircuit 182 is variable and is controlled by the bias voltage presented at $V_{BIAS}$. Responsive to $I_C$, current mirror 158 causes $I_P$ to flow out of the drain of PMOS FET 194 in proportion to $I_C$, by a factor M, into load 154 and/or output driver circuit 156.

$I_N$ is produced by output driver circuit 156 in response to the input signal provided at $V_{IN}$. Circuit 156 is preferably a degenerated common-collector, common-emitter pair as is well known in the art. To prevent saturation of transistor 170, PNP BJT 176 is provided in output stage 150 to decrease the current flowing into the base of transistor 166 when the voltage at the collector of transistor 170 falls below a threshold value.

A circuit 200 for producing a desired bias voltage for a $V_{BIAS}$ of one or more output stages 60 (FIG. 2) is illustrated in FIG. 6. Circuit 200 produces the desired bias voltage by mimicking the voltages and currents produced by output stage 60 while output stage 60 is operating at idling point 94. More particularly, the voltages produced in many of the components of circuit 200 are identical to voltages produced in the corresponding components of output stage 60. For example, the gate-to-source, and in most cases also the drain-to-source, voltages produced in FETs 218, 210, 208, 216 and 214 are identical to the voltages produced in FETs 62, 64, 72, 76 and 78, respectively, of output stage 60.

The currents produced in these components of circuit 200 may be either identical to or proportional to the currents in the corresponding components of output stage 60. For example, in order to conserve power, the currents in circuit 200 may be scaled down proportionally to the currents in output stage 60. The transistor sizes, and hence transconductance ("K") parameters, of the transistors in circuit 200 must be scaled according to their currents, in order to achieve the same operating terminal voltages. By mimicking the voltages and currents produced in output stage 60 under similar operating conditions, a $V_{BIAS}$ voltage is produced by circuit 200 so that an idling current is produced in output stage 60 that is independent of variations in integrated circuit manufacturing processes, temperature, and power supply voltages and is dependent only upon current sources in circuit 200 and device size ratios. By mimicking circuit 60 in this way, the process, temperature, and supply voltage dependencies of the devices in circuit 200 tend to cancel those in circuit 60.

The generation of the desired $V_{BIAS}$ voltage in circuit 200 is controlled by current sources 202 and 204. Current sources 202 and 204 may be implemented using any known circuits or methods. The currents produced by current sources 202 and 204 may be either identical to, or proportional to, the idle current $I_Q$ desired in output stage 60. Each of the currents produced by current sources 202 and 204 drive one of two overlapping negative feedback loops. These feedback loops operate to establish the voltages at the gates of FETs 214, 216, and 218 that cause the full currents provided by current sources 202 and 204 to flow through FETs 210, 212, and 218.

One negative feedback loop can be traced from node 240, to the gate of FET 216, through two-transistor complementary subcircuit 232, current mirror 206, cascode FET 212 and back to node 240. This feedback loop maintains current $I_2$ at the exact value of current source 202 by adjusting the voltages and currents in the loop to correct deviations in $I_2$ away from the exact value of current source 202. More particularly, if FETs 210 and 212 did not conduct the exact value of current source 202, then the DC current flow into node 240 would not equal the DC current flow out of node 240, and, as is known from Kirchhoff's Current Law, the voltage at node 240 would begin to increase or decrease as the transistor capacitances at node 240 charged up or down. This increase or decrease in voltage at node 240 would result in a restoring effect tending to direct the current in FETs 210 and 212 toward the full value of current source 202.

For example, if the drain current in FETs 210 and 212 were to decrease to below the exact value of current source 202, then the voltage at node 240 would tend to become more positive in voltage. This increase in voltage would cause the gate voltages of FETs 216 and 218 to increase, and the gate voltage of FET 214 to decrease as a result of the inverting action of FET 218. Because of the increase in the voltage across the gates of FETs 214 and 216, 13 in subcircuit 232 would increase similarly to $I_3$ in subcircuit 80 of FIG. 2. This increase in current in subcircuit 232 would then cause the current in FET 210 of current mirror 206 and in FET 212 to increase, thereby restoring $I_2$ to the exact value of current source 202.

Another negative feedback loop can be traced from the gate of FET 214, through subcircuit 232, current mirror 206, and cascode FET 212, to the gate of FET 218, through FET 218, and back to $V_{BIAS}$. Analogously to the first feedback loop, this feedback loop operates to maintain the current $I_4$ flowing through FET 218 at the exact value of current source 204. If FET 218 did not conduct the exact value of current source 204, then the DC current flow into node 242 would not equal the DC current flow out of node 242, and, as is known from Kirchhoff's Current Law, the voltage at node 242 would begin to increase or decrease as the transistor capacitances charged up or down. This increase or decrease in voltage at node 242 would result in a restoring effect tending to direct the current in FET 218 toward the exact value of current source 204.

For example, if $I_4$ flowing through FET 218 were to fall below the exact value of current source 204, then the voltage at node 242 would tend to become less positive. This decrease in voltage at node 242, and, consequently, the gate of FET 214 of subcircuit 232, would cause an increase in $I_3$ flowing in subcircuit 232. Responsive to this increase in $I_3$, current mirror 206 would cause a proportional increase in $I_2$. As stated above, such an increase in current would cause a decrease in voltage at node 240 and the gate of FET 218. This decrease in gate voltage at FET 218 would result in a restoring effect that increases $I_4$ in FET 218 to the exact value of current source 204.

As stated above, because FETs 218, 216, 214, 208 and 210 are selected to exhibit substantially identical voltages and substantially identical or proportional currents to those produced in FETs 62, 76, 78, 72 and 64 of output stage 60, respectively, the voltages produced by these feedback loops are those that will be produced in output stage 60 when operating at idling point 94. More particularly, since $I_4$ flowing through FET 218 matches, or is proportional to, $I_Q$ in FET 62, it is apparent that the gate voltage of FET 218 is equal to $V_{IN}$'s idling value $V_{INQ}$ of output stage 60. Also, since $I_2$ flowing through FET 210 matches, or is proportional to, $I_Q$ in FET 64, it is apparent that $I_3$ flowing through subcircuit 232 matches, or is proportional to, $I_1$ flowing through FETs 76, 78 and 72 of output stage 60. Because subcircuit 232 behaves like subcircuit 80, and because the gate of FET 216 has a voltage equal to the idling input voltage $V_{INQ}$ of output stage 60, and because $I_3$ flowing through subcircuit 232 matches $I_1$ in subcircuit 80 when operating at idling point 94, it follows that the voltage at the gate of FET 214, and consequently $V_{BIAS}$, matches the required $V_{BIAS}$ for output stage 60 to operate at the idling point.

As illustrated in FIG. 6, cascode FET 212 and capacitor 220 are provided in circuit 200. Under the control of a reference voltage 226 connected to its gate, cascode FET 212 allows the drain-to-source voltage of FET 210 to be fixed so that the $V_{DS}$ of FET 210 matches the $V_{DS}$ of FET 64 (FIG. 2) at idle. Capacitor 220 stabilizes the feedback loops in the $V_{BIAS}$ generator by preventing oscillations. Capacitor 220 is connected between $V_{BIAS}$ and ground 230. It is desirable, although not mandatory, to place capacitor 220 at $V_{BIAS}$ because it is desirable to place the dominant pole of a regulator at the output. Capacitor 220 then not only stabilizes the feedback loops against oscillations, but also guarantees low output impedance at most frequencies and absorbs transient currents on $V_{BIAS}$.

$V_{BIAS}$ generator 200 in FIG. 6 is designed for use with, and contains transistors whose operating conditions mimic those of transistors in, output stage 60 of FIG. 2. Each of the other output stage circuits that are variants of circuit 60, such as those in FIGS. 4 and 5 as well as other variants not illustrated, needs a corresponding $V_{BIAS}$ generator. In each case, a $V_{BIAS}$ generator analogous to circuit 200 can be constructed following the principles described above for circuit 200 and its relationship to output stage 60.

Persons skilled in the art will thus appreciate that the present invention can be practiced by other than the described embodiments, which are presented for purposes of illustration and not of limitation, and the present invention is limited only by the claims that follow.

What is claimed is:

1. A rail-to-rail output stage that produces an output signal resulting in a load current in a load in response to an input signal received at a signal input, comprising:

an output driver, controlled by said input signal, that at least partially controls said load current in said load, said output driver comprising a transistor having a control terminal responsive to the input signal, and that has a square-law factor K (amperes per squared volt);

a complementary subcircuit, controlled by said input signal and a bias voltage, that comprises two transistors of different polarity, that produces a subcircuit current, and that has a combined square-law factor Kc (amperes per squared volt); and a current mirror, controlled by said subcircuit current, that at least partially controls said load current in said load and that has a current ratio M, wherein said subcircuit and said current mirror produce a first non-linear component in said output signal that cancels a second non-linear component in said output signal produced by said output driver, and wherein said output driver, said subcircuit, and said current mirror are sized so that said square-law factor K substantially equals said square-law factor Kc multiplied by said current ratio M.

2. The output stage of claim 1, wherein said bias voltage influences an idling current produced in said output stage.

3. The output stage of claim 1, wherein said output driver is a PMOS FET having a gate responsive to said signal input and a drain that drives said load current in said load.

4. The output stage of claim 1, wherein said output driver is an NMOS FET having a gate responsive to said signal input and a drain that drives said load current in said load.

5. The output stage of claim 1, wherein said output driver comprises an NPN transistor having a base responsive to said signal input and a collector that drives said load current in said load.

6. The output stage of claim 5, further comprising a PNP transistor having a base responsive to the voltage at said collector of said NPN transistor and an emitter that causes said base of said NPN transistor to be less responsive to said input signal.

7. The output stage of claim 1, wherein said output driver comprises:

a first NPN transistor having a base responsive to said signal input; and a second NPN transistor having a base responsive to an emitter of said first NPN transistor and a collector that drives said load current in said load.

8. The output stage of claim 7, further comprising a PNP transistor having a base responsive to said collector of said second NPN transistor and an emitter that causes said base of said first NPN transistor to be less responsive to said input signal.

9. The output stage of claim 1, wherein said subcircuit comprises:

an NMOS FET having a gate responsive to said signal input, and a source; and a PMOS FET having a gate responsive to said bias voltage, a drain that passes said subcircuit current to said current mirror, and a source responsive to said source of said NMOS FET.

10. The output stage of claim 1, wherein said subcircuit comprises:

a PMOS FET having a gate responsive to said signal input, and a source; and an NMOS FET having a gate responsive to said bias voltage, a drain that passes said subcircuit current to said current mirror, and a source responsive to said source of said PMOS FET.

11. The output stage of claim 1, wherein said subcircuit comprises:

a PMOS FET having a gate responsive to said signal input, and a source; and an NPN transistor having an emitter responsive to said source of said PMOS FET, a base responsive to said bias voltage, and a collector that passes said subcircuit current to said current mirror.

12. The output stage of claim 1, wherein said current mirror comprises:

a first NMOS FET having a drain and a gate responsive to an output of said subcircuit; and a second NMOS FET having a drain that drives said load current in said load and a gate responsive to said drain and said gate of said first NMOS FET.

13. The output stage of claim 1, wherein said current mirror comprises:

a first PMOS FET having a drain and a gate responsive to an output of said subcircuit; and a second PMOS FET having a drain that drives said load current in said load and a gate responsive to said drain and said gate of said first PMOS FET.

14. The rail-to-rail output stage of claim 1, wherein the output stage has an idling point at which an idling current is produced when said input signal equals a DC voltage and a bias input equals said bias voltage, further comprising:

a first current source that produces a first current which is proportional to said idling current;

a transistor that passes a first current amount that includes at least a portion of said first current, that controls said first current amount being passed in response to an input voltage, and that passes said first current amount equal to said first current when said input voltage is equal to said DC voltage;

a second current mirror that has a current mirror output which passes a second current amount including at least a portion of a second current, and that controls said second current amount being passed in response to a second subcircuit current;

a second current source that produces said second current which is proportional to said idling current and that causes said input voltage to change in response to said second current amount being passed by said second current mirror; and a second complementary subcircuit that has a first input that is controlled by said input voltage, a second input that is responsive to whether said transistor is passing said first current amount equal to said first current, and an output that produces said second subcircuit current in an amount that is responsive to said first input and said second input of said second subcircuit, such that when said second subcircuit produces said second subcircuit current that causes said second current mirror to pass said second current amount equal to said second current and said input voltage equals said DC voltage, said bias voltage is present at said second input.

15. The circuit of claim 14, further comprising a capacitor that stabilizes said circuit by preventing oscillations.

16. The circuit of claim 15, further comprising a cascode transistor that enables a voltage at said current mirror output to be fixed.

17. A method for producing an output signal resulting in a load current in a load in response to an input signal received at a signal input, comprising:

selecting an output driver having a square-law factor K (amperes per squared volt) and comprising a transistor having a control terminal, a complementary subcircuit having a combined square-law factor Kc (amperes per squared volt), and a current mirror having a current ratio M so that said square-law factor K substantially equals said square-law factor Kc multiplied by said current ratio M;

controlling at least part of said load current in said load using said transistor such that said control terminal is responsive to said input signal;

producing a subcircuit current in said complementary subcircuit that comprises two transistors of different polarity in response to said input signal and a bias voltage;

controlling at least part of said load current in said load using said current mirror in response to said subcircuit current produced in said subcircuit; and using said subcircuit current and said current mirror to generate a first non-linear component in said output signal that cancels a second non-linear component in said output signal produced by said output driver.

18. The method of claim 17, wherein said bias voltage influences an idling current produced in said output driver and said current mirror.

19. The method of claim 17, wherein said output driver is a PMOS FET having a gate responsive to said signal input and a drain that drives said load current in said load.

20. The method of claim 17, wherein said output driver is an NMOS FET having a gate responsive to said signal input and a drain that drives said load current in said load.

21. The method of claim 17, wherein said output driver comprises an NPN transistor having a base responsive to said signal input and a collector that drives said load current in said load.

22. The method of claim 21, further comprising a PNP BJT having a base responsive to the voltage at said collector of said NPN transistor and an emitter that causes said base of said NPN transistor to be less responsive to said input signal.

23. The method of claim 17, wherein said output driver comprises:

a first NPN transistor having a base responsive to said signal input; and a second NPN transistor having a base responsive to an emitter terminal of said first NPN transistor and a collector that drives said load current in said load.

24. The method of claim 23, further comprising a PNP BJT having a base responsive to the voltage at said collector of said second NPN transistor and an emitter that causes said base of said first NPN transistor to be less responsive to said input signal.

25. The method of claim 17, wherein said subcircuit comprises:

an NMOS FET having a gate responsive to said signal input; and a PMOS FET having a gate responsive to said bias voltage, a drain that passes said subcircuit current to said current mirror, and a source responsive to a source of said NMOS FET.

26. The method of claim 17, wherein said subcircuit comprises:

a PMOS FET having a gate responsive to said signal input; and an NMOS FET having a gate responsive to said bias voltage, a drain that passes said subcircuit current to said current mirror, and a source responsive to a source terminal of said NMOS FET.

27. The method of claim 17, wherein said subcircuit comprises:

a PMOS FET having a gate responsive to said signal input; and an NPN transistor having an emitter responsive to a source of said PMOS FET, a base responsive to said bias voltage, and a collector that passes said subcircuit current to said current mirror.

28. The method of claim 17, wherein said current mirror comprises:

a first NMOS FET having a drain and a gate responsive to an output of said subcircuit; and a second NMOS FET having a drain that drives said load current in said load and a gate responsive to said drain and said gate of said first NMOS FET.

29. The method of claim 17, wherein said current mirror comprises:

a first PMOS FET having a drain and a gate responsive to an output of said subcircuit; and a second PMOS FET having a drain that drives said load current in said load and a gate responsive to said drain and said gate of said first PMOS FET.

30. The method of claim 17, further comprising:

producing an idling current at an idling point when said input signal equals a DC voltage and a bias input equals said bias voltage;

producing a first current that is proportional to said idling current using a first current source;

in a transistor, passing a first current amount including at least a portion of said first current, controlling said first current amount being passed in response to an input voltage, and passing said first current amount equal to said first current when said input voltage is equal to said DC voltage;

in a second current mirror having a current mirror output, passing a second current amount including at least a portion of a second current, and controlling said second current amount being passed in response to a second subcircuit current;

in a second current source, producing said second current that is proportional to said idling current and causing said input voltage to change in response to said second current amount being passed by said second current mirror; and in a second complementary subcircuit having a first input controlled by said input voltage and a second input responsive to whether said transistor is passing said first current amount equal to said first current, producing said second subcircuit current in an amount responsive to said first input and said second input of said second subcircuit such that when said second subcircuit produces said second subcircuit current causing said second current mirror to pass said second current amount equal to said second current and said input voltage equals said DC voltage, said bias voltage is present at said second input.

31. The method claim 30, further comprising stabilizing said circuit by preventing oscillations using a capacitor.

32. The method of claim 31, further comprising enabling a voltage at said current mirror output to be fixed using a cascode transistor.

* * * * *

UNITED STATES PATENT AND TRADEMARK OFFICE

CERTIFICATE OF CORRECTION

PATENT NO. : 6,265,929 B1
DATED : July 24, 2001
INVENTOR(S) : Max Wolff Hauser

It is certified that error appears in the above-identified patent and that said Letters Patent is hereby corrected as shown below:

Title page, Item [54], and Column 1, lines 1-4,
Title, change "CIRCUITS AND METHODS FOR PROVIDING RAIL-TO-RAIL OUTPUT WITH HIGHLY LINEAR TRANSCONDUCTANCE PERFORMANCE" to
-- CIRCUITS AND METHODS FOR PROVIDING RAIL-TO-RAIL OUTPUT STAGES WITH HIGHLY LINEAR TRANSCONDUCTANCE PERFORMANCE --;
Item [56], change "Circuit", IEEE" to -- Circuit", IEEE --.

Signed and Sealed this

Seventh Day of May, 2002

*Attest:*

JAMES E. ROGAN

*Attesting Officer*

*Director of the United States Patent and Trademark Office*